US009787519B2

(12) United States Patent
Dabiri et al.

(10) Patent No.: US 9,787,519 B2
(45) Date of Patent: *Oct. 10, 2017

(54) MULTI-RATE TRANSMISSIONS OVER TWINAX CABLES

(71) Applicant: APPLIED MICRO CIRCUITS CORPORATION, Sunnyvale, CA (US)

(72) Inventors: Dariush Dabiri, San Jose, CA (US); Tarun Gupta, Santa Clara, CA (US); Venkatesh Nagapudi, Milpitas, CA (US)

(73) Assignee: MACOM CONNECTIVITY SOLUTIONS, LLC, Lowell, MA (US)

( * ) Notice: Subject to any disclaimer, the term of this patent is extended or adjusted under 35 U.S.C. 154(b) by 65 days.

This patent is subject to a terminal disclaimer.

(21) Appl. No.: 14/466,327

(22) Filed: Aug. 22, 2014

(65) Prior Publication Data

US 2015/0326376 A1  Nov. 12, 2015

Related U.S. Application Data

(60) Provisional application No. 61/869,395, filed on Aug. 23, 2013.

(51) Int. Cl.
*H03M 13/25* (2006.01)
*H04L 27/34* (2006.01)
(Continued)

(52) U.S. Cl.
CPC ...... *H04L 27/3483* (2013.01); *H03M 13/253* (2013.01); *H03M 13/3916* (2013.01); *H04B 1/38* (2013.01); *H04B 3/02* (2013.01); *H04L 1/0041* (2013.01); *H04L 1/0045* (2013.01); *H04L 1/0058* (2013.01);
(Continued)

(58) Field of Classification Search
USPC .......................................................... 370/276
See application file for complete search history.

(56) References Cited

U.S. PATENT DOCUMENTS

| 8,069,293 B1 * | 11/2011 | Rogan ................... G06F 13/385 370/248 |
| 2007/0103204 A1 * | 5/2007 | Egan ...................... G09G 5/006 327/100 |

(Continued)

OTHER PUBLICATIONS

International Search Report & Written Opinion for PCT Application Serial No. PCT/US2015/042789, mailed Nov. 11, 2015, 13 pages.

*Primary Examiner* — Mark Rinehart
*Assistant Examiner* — Kokou R Detse
(74) *Attorney, Agent, or Firm* — Amin, Turocy & Watson LLP

(57) ABSTRACT

Cable systems and assemblies integrate a reduced number of twin axial cables to transmit and received in a full-duplex transmission signals at transmission speeds greater than or equal to one hundred Giga bytes per second. The reduced number of twin axial cables comprise four or less twin axial cables, in which each pair forms a single twin axial full-duplex cable for passive or active communication of the signals at multiple different transmission rates concurrently. A processor can be integrated with the twin axial cables and operate to encode the signals for fast transmission speeds at the different transmission rates.

20 Claims, 11 Drawing Sheets

(51) Int. Cl.
  *H04L 5/14*    (2006.01)
  *H04B 1/38*    (2015.01)
  *H04B 3/02*    (2006.01)
  *H04L 27/00*   (2006.01)
  *H04L 1/00*    (2006.01)
  *H03M 13/39*   (2006.01)
  *H04L 7/04*    (2006.01)
  *H03M 13/13*   (2006.01)

(52) U.S. Cl.
  CPC .......... *H04L 1/0061* (2013.01); *H04L 1/0067* (2013.01); *H04L 5/14* (2013.01); *H04L 5/1423* (2013.01); *H04L 7/042* (2013.01); *H04L 27/0002* (2013.01); *H03M 13/134* (2013.01)

(56) References Cited

U.S. PATENT DOCUMENTS

| | | |
|---|---|---|
| 2009/0232151 A1 | 9/2009 | Furlong et al. |
| 2010/0232492 A1 | 9/2010 | Mezer et al. |
| 2011/0051741 A1 | 3/2011 | Diab et al. |
| 2013/0117639 A1* | 5/2013 | Ganga ................ H03M 5/145 714/776 |
| 2014/0258813 A1 | 9/2014 | Lusted et al. |

\* cited by examiner

MULTI-RATE TRANSMISSIONS OVER TWINAX CABLES

CROSS-REFERENCE TO RELATED APPLICATION(S)

The subject application for patent claims priority to U.S. Provisional Patent Application No. 61/869,395 entitled "TRANSMISSION OVER REDUCED PAIRS OF TWINAX CABLES AND COMMUNICATION CODING" filed Aug. 23, 2013, which is incorporated by reference herein in its entirety and for all purposes.

TECHNICAL FIELD

The subject disclosure relates generally to full duplex transmissions and more particularly to systems, methods, and devices associated with multi-rate transmissions over reduced pairs of twin axial cables.

BACKGROUND

Cables are often utilized as physical media to connect devices that may be networked. Signals can be sent over a physical layer of wires, for example, in which signal coding can be used for enhancing the transmission. The cable can include a data link layer for messages sent between a controller (master) and a slave device. The messages could have a set of normal bits for bit synchronization, followed by a frame sync pattern, for example. The frame sync pattern, for example, can be followed by data bit frames, in which each frame could include a start bit, a bit data field, a parity bit and/or a set of fill bits of zero.

For applications requiring a high data rate with low latency performance, such as in Storage Area Networks and High Performance Computing, the interconnect media selected should have a very high bandwidth capacity, such as with twin axial (twinax) cable, to support the un-modulated baseband signal. To obtain low latency while having low power dissipation, baseband digital communication is typically used instead of a complex modulation scheme requiring sophisticated coding techniques. A drawback is media analog bandwidth. For example, in order to support 10 Gbps (Gigabytes per second) data communication, the media support a certain frequency Hertz of analog bandwidth. To achieve these bandwidths, current solutions use eight or more pairs of twin axial cables.

The above-described description is merely intended to provide a contextual overview of current cable interconnects and is not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

Various embodiments for twin axial transmission over a reduced number of twinax pairs integrated together at respective ends are disclosed herein. An exemplary cable assembly comprises four or less twin axial cables configured for communicating signals in opposite directions. A plug assembly is configured for integrating one end of the twinax cables with an interconnect, and connecting another end with an interface port. The plug assembly comprises a transceiver configured for communicating the signals in the opposite directions to and from the interface port, wherein the transceiver transmits a first signal at a first transmission rate and transmits a second signal at a second transmission rate, wherein the second transmission rate is different from the first transmission rate, via the twinax cables. A processor operatively coupled to the transceiver that is configured for digital signal processing of the signals via the set of twinax cables.

In another embodiment, a method comprises receiving signals from four or less twin axial cables via a plug assembly comprising a processor and a transceiver. The method further includes encoding the signals with communication protocols by the processor. The method also includes transmitting, by the transceiver, a first signal at a first transmission rate, and a second signal at a second transmission rate different from the first transmission rate concurrently via separate twin axial cables.

In yet another embodiment, a device comprises a memory to store computer-executable instructions, and a first processor, coupled to the memory, that facilitates execution of the computer-executable instructions to perform operations. The operations involve receiving a set of signals from a first device, encoding the set of signals to a set of encoded signals, and transmitting the set of encoded signals via four or less twinax cables, such that at least two different twinax cables are configured for transmitting respective encoded signals simultaneously in a first direction at separate transmission rates.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
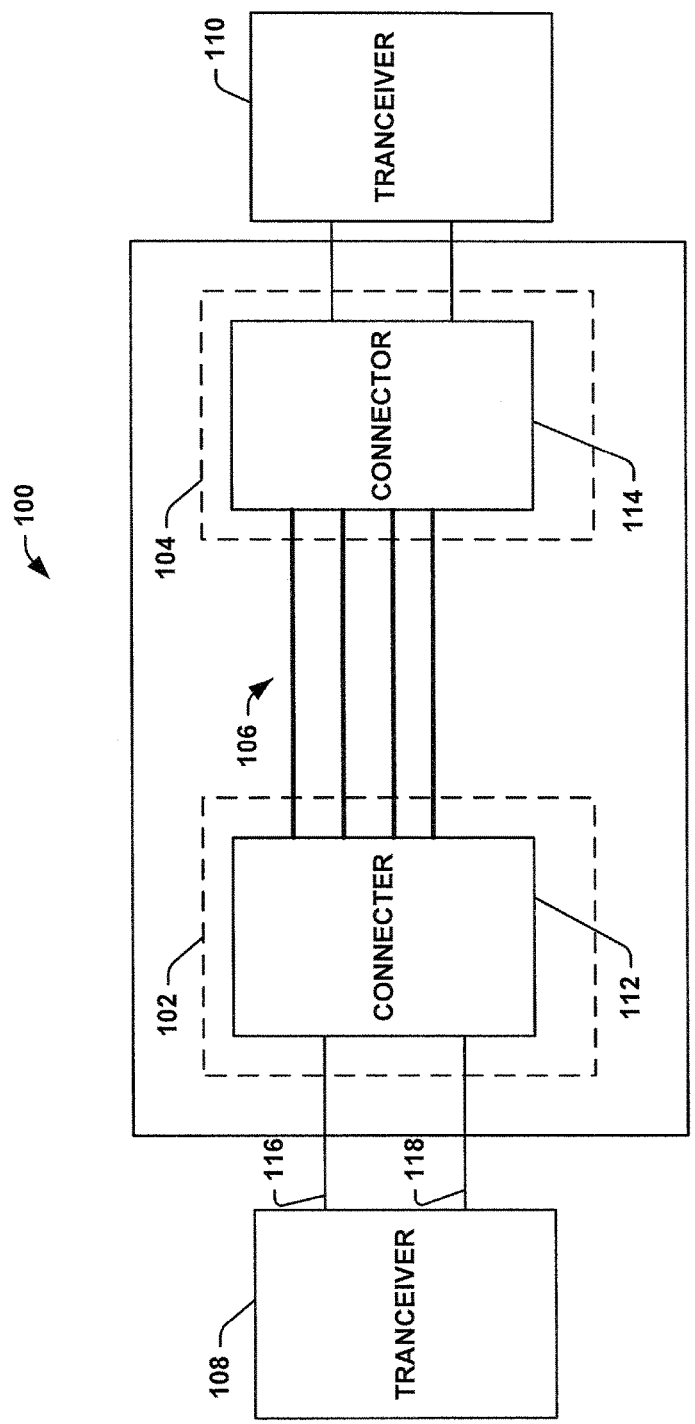
FIG. 1 is a block diagram illustrating an example, non-limiting embodiment of a cable assembly system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

In consideration of the above-described trends or deficiencies among other things, various embodiments are provided for 100 Gbps transmission rates or greater for full-duplex communications over a reduced number or set of twinaxial (twinax) pairs. For example, a cable assembly can include a set of twinaxial (or "twinax") cables that can each comprise a full-duplex twinax pair of conductors or a half-duplex twinax pair of conductors. The cable assembly can be configured for communicating one or more signals in two directions simultaneously at transmission speeds of 100 Gigabytes per second or greater, such as processing or transmitting communications at speeds greater than 150 Gigabytes per second or greater than 200 Gigabytes per second. This bandwidth is achieved using a reduced number of twin axial cables, such as four pairs of twin axial cables. This reduced number of twinax cables over the previous designs of eight or more pairs of twin axial cables allows for reduced wiring costs, and simplified design layouts. In addition, the cable assembly can operate to communicate at various transmission speeds concurrently, simultaneously or at substantially the same time. One twin axial cable can comprise, for example, a twin axial conductor pair, or, in other words, two inner conductors. The cable assembly can comprise, for example, four twin axial cables that comprise four twinax pairs of full-duplex twin axial conductors so that each twin axial cable comprises a twin axial pair (pair of conductors) integrated together to form one cable assembly that can communicate between workstations or devices in high speed, full-duplex communications of data signals for further networking of components or processing. The cable assembly can also comprise four or less than four twin axial cables for transmitting a signal at different transmission rates.

The twin axial cables can communicate signals according to a full-duplex data transmission, for example, which means that data can be transmitted in both directions on a signal carrier at the same time or simultaneously, or in a half-duplex mode where one direction is communicated at a time. For example, on a local area network with a technology that has full-duplex transmission, one workstation (e.g., device) can be sending data via the cable assembly over at least one conductor of the twinax pair of a twinax cable, while another workstation is receiving data across the same or different twinax pair, or, in other words, over the set of twinax pairs integrated within the cable assembly, in which a "set" as used herein can mean "one or more." In addition or alternatively, a first workstation or device can transmit data, via the cable assembly with a set of twinax pairs, to a second workstation that receives the transmitted data, while the second workstation can also transmit data at the same time, via the cable assembly, to the first workstation that can receive the data transmitted from the second workstation.

Full-duplex transmission implies a bidirectional communication path or line (one that can move data in both directions). Each twinax pair can comprise or constitute a full-duplex twinaxial (twinax) cable. For example, the twinaxial cables can comprise a two-conductor twisted balanced wire, which can have the same or different impedances and a shielding braid that can be wrapped around the two wires or the two conductors. Unlike a simple coaxial cable, twinax wire pairs can include two inner conductors instead of one.

In one embodiment, the cable assembly can be configured as a passive cable device or as an active cable device, in which either can operate at speeds of at least one hundred Gigabytes per second (100 Gbps) with a reduced number of twinax cable pairs within the cable assembly, such as four or less twinax cable pairs being integrated into the one cable assembly. Processing of communications can also be performed at multi-rate speeds within the same cable assembly. For example, the cable assembly can comprise a set of four twinax pairs that communicate from a first device to a second device at a transmission rate (speed) of at least one hundred Gigabytes per second. In addition or alternatively, the cable assembly can communicate data at a transmission rate of at least forty Gigabytes per second in two of the twinax pairs and concurrently, at substantially the same time, or simultaneously communicate at a transmission rate of at least ten Gigabytes per second in another two of the twinax pairs. In addition or alternatively, two or more of the twinax pairs of the cable assembly can communicate together at transmission rates of at least 40 Gbps each, at transmission rates of 10 Gbps each, or at different variations depending upon the communication speed selected via an external device or a processor within the cable assembly itself. The twinax cable pairs can comprise a pair of copper cables, wires or conductors that deliver a high performance option to the interconnections between devices at short and long range distances with increased speed. Although copper conductor, wires, and the like are discussed within various embodiments, cables or twinax pairs with metal conductors other than copper are also envisioned (e.g., metals and alloys such as one or more but not limited to gold, silver, platinum, or the like).

Turning initially to FIG. 1, illustrated is an aspect of a cable assembly 100 that is configured as a passive cable device for communicating signals in a full-duplex transmission mode at 100 Gbps via four pairs of conductors or less, eight conductors total or less, four pairs of twinax pairs or less, or, in other words, four twinax cables or less. The cable assembly 100 comprises a plug assembly 102 and a plug assembly 104 that can respectively operate as an end housing that integrates and combines interconnects and components for facilitating full-duplex communications between, devices or device components along a reduced set of full-duplex twinax wire pairs 106.

The plug assemblies 102 and 104 can be located at each end of the cable assembly 100 and configured for integrating the respective ends of the set of full-duplex twinax wire pairs 106 with one or more receiving ports or plugs (not shown) of user devices (not shown) for signal communication via the twinax pairs 106. Each twinax pair of the pairs 106 can comprise a pair of conductors or a single twinax cable within the cable assembly 100, which can operate to transmit communications at different transmission rates concurrently or simultaneously in the same direction based on different communication protocols or selected transmission rates.

For example, one or more twinax pairs can transmit communications at speeds of 40 Gbps or more and one or more other twinax pairs within the cable assembly 100 can operate to transmit communications at the same time at one or more different speeds. Based on the desired transmission speed or selected rate of linking external devices (e.g., a first device or a second device—not shown), the set of twinax pairs 106 can communicate multiple different rates across different twinax pairs of the twinax pairs 106 at the same time. Afterwards, the desired speed for respective twinax pairs can potentially be altered for the twinax configuration based on a different selected rate to communicate different data with different rates across different twinax pairs. In an aspect, the twinax pairs 106 can be configurable to process data at different rates from one another so that a first twinax pair transmits at a first rate, a second twinax pair transmits at a second different rate, a third twinax pair transmits at a third different rate, and/or the fourth twinax pair transmits at a fourth different rate.

For example, a device communication could demand transmission speeds of 100 Gbps or greater, and thus, a first and a second twinax pair can transmit at 40 Gbps, while the two other twinax pairs communicate at 10 Gbps each. Afterwards, the cable assembly 100 can change the configuration to process three of the twinax pairs at 10 Gbps each and one at 40 Gbps, for example. Other variations in other aspects based on the demand of one or more external devices can also be utilized for transmission via the cable assembly 100. For example, the cable assembly 100 can comprise two twinax pairs each comprising a copper twisted pair or two conductors. The two twinax pairs can include a first twinax pair that communicates at a first rate or transmission speed (e.g., 40 Gbps) and a second twinax pair that communicates at a second rate or transmission speed (e.g., 10 Gbps).

The plug assemblies 102 and 104 can also comprise a transceiver 108 and a transceiver 110 respectively for receiving and transmitting signals, which can be integrated with a processor as a transceiver microprocessor or controller respectively. The transceivers 108 and 110 can also be located on a circuit board of a user device and operatively coupled to connectors 112 and 114 at each of the twinax cable ends so that the transceivers 108 and 110 are external to the plug assemblies 108 and 110. The transceivers 108 and 110 can comprise traces on a circuit board (not shown), for example, or other conductor interfaces or paths that provide interconnections (e.g., copper interconnects) to the twinax pairs 106 and the transceivers 108 and 110 via the plug assemblies 102 and 104.

In one example, the transceivers 108 and 110 can be located on a reception or receiving port, jack or sleeve on a respective user device, such as a processor device and other component device connected via the cable assembly 100. The transceivers 108 and 110, for example, can support various communication protocols such as Ethernet, Sonet/SDH, Fibre Channel applications across various switching and routing architectures for implementation in Local Area Network (LAN), Wide Area Network (WAN), Metropolitan Area Network (MAN), ring networks, storage area networks and the like, as well as for communications between devices that can be connected within these networks for various transmission media. Alternatively or additionally, the transceivers 108 or 110 can operate as a receiver that receives and processes communication transmissions or as a transmitter that transmits and processes communication data for transmission only. The transceiver 108, 110 can further include multiple transceivers for receiving or transmitting communications.

In one embodiment, the transceivers 108 and 110 can comprise one transceiver at each end of the cable assembly 100 and that is operatively coupled to the connector 112 and the connector 114 respectively. For example, a receive path or line 116 and a transmit path or line 118 from the transceiver 108 to the connector 112 enables communication signals to be transmitted and received to the connector 112 via the twinax cables 106 that each comprise a twinax cable pair of conductors. The receive path 116 and transmit path 118 illustrated can be routed traces, or other interconnects (e.g., copper interconnects), which can operate to receive and/or transmit over the same interconnect.

The twinax cables 106 can operate to transmit and receive data that can be encoded, partitioned or reformatted for transmission via the connectors 112, 114 at 100 Gbps (Gbps) or at greater transmission rates, for example, and at multiple different transmission rates concurrently or simultaneously. The connectors 112 and 114 can be different from one another or the same, for example, and further comprise interfaces that can function to automatically terminate the twinaxial cables or twinaxial pairs, integrate the transmissions between different impedances, or convert between signals that can be balanced or unbalanced. The connectors 112 and 114 can, for example, comprise interfaces that enable signals received or transmitted to comply with a multitude of standards and integrate the twinax pairs to share a common connector for joining to an electronic device. In one example, multiple different standards could be transmitted over the same cable and/or different twinax pairs with various pin connections or trace connections within each connector 112 or 114. Each connector, for example, can comprise a clock (not shown) for re-timing or re-clocking different signals also. The connectors 112 and 114 can comprise balun connectors for the twinax pairs and/or other interfaces, for example, such as a Medium Dependent Interface (MDI), PMDA, SERDES, etc.

Figure 2:
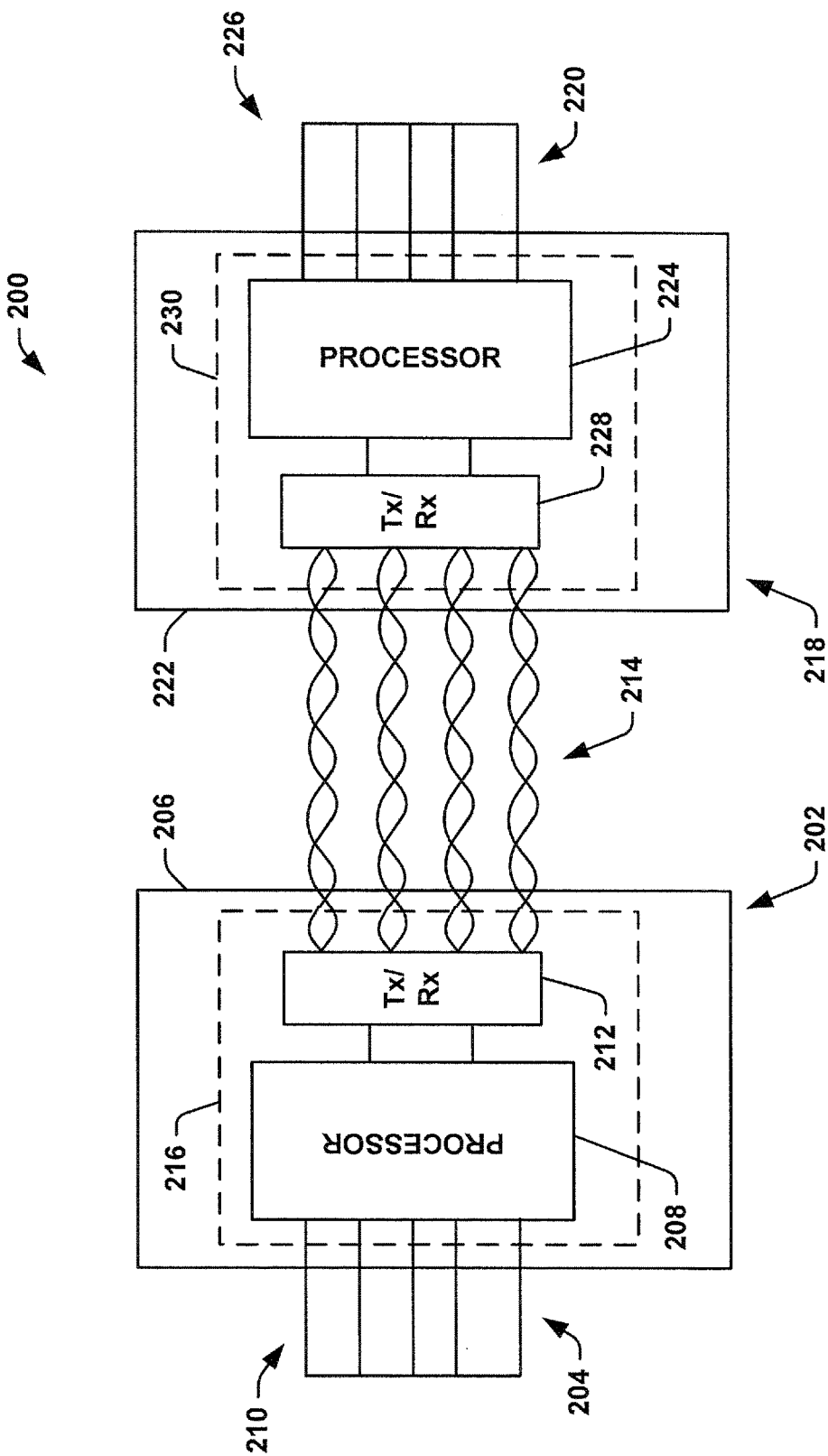
FIG. 2 is a block diagram illustrating another example, non-limiting embodiment of a cable assembly system in accordance with various aspects described herein.

Referring now to FIG. 2, illustrated is an embodiment of a cable assembly 200 that comprises a first end section 206 and a second end section 222 for an interconnection or integration of one or more devices (not shown), such as a computer device, mobile processing device, display device personal digital assistant, etc. with the cable assembly 200 and its functional components. The cable assembly 200 is operable as an active twinax cable device for high speed, full-duplex transmissions among devices or device processors with a reduced set of twinax conductor pairs (e.g., four or less twinax pairs) that can transmit data at multiple different rates from one another. Additionally, the cable assembly 200 can operate to simultaneously transmit and receive data at a transmission speed of 100 Gbps or greater for one or more different communication protocols. Additionally or alternatively, the cable assembly 200 comprising four or less twinax pairs can operate to simultaneously transmit and receive data at a transmission speed of 100 Gbps or greater for one or more different communication protocols for different transmission rates, at the same time.

For example, the cable assembly 200 comprises an interface 210 and an interface 226 at each end that can include a set of interconnects 204 and 220 (e.g., copper interconnects or paths) that interface with a receiving port or a plug such as a Quad Small Form-factor Pluggable (QSFP), a Small Form-factor Pluggable, or other pluggable connector. The interface 210 and 226 can be operatively connected to a circuit board 216 and 230, a surface mount or a processor package mount (e.g., a ball grid array or the like) having a processor 208 and 224. The interface 210 and 226 includes a plug portion of the cable assembly 200, which operates as a mate for connection to a plug or port of a device or processing device for communication between one or more other devices. The cable assembly 200 operates as an active cable device that draws or consumes power at one or more ends of the assembly 200, and further processes, encodes and decodes transmissions of one or more communication protocols with low bit error rates and high efficiency. The cable assembly 200, for example, can draw power from an internal power source integrated via the circuit board or surface mount 216 and/or 230, or from power drawn from a connecting device via at least one of the interfaces 210 and 226.

The cable assembly 200 can comprise plug assemblies 202 and 218 at respective ends of the cable assembly 200. The plug assemblies 202 and 218 can comprise the plug portion or the interface 210 that operates as the mate for connection to a plug or port of a device and can operate to integrate the twinax pairs 214 for transmission as one communication pipeline from one device to another device (not shown) that is external. The plug assembly 202 or 218 can comprise a processor 208 or 224 operatively connected to the circuit board 216 or 230 or a surface mount respectively. The processor 208 or 224 can operate with a transceiver 212, 228 to encode, decode, partition, or process error correction code (ECC) such as Forward Error Correction Code (FEC) according to one or more algorithms that can enable high speed, full-duplex transmissions of data at 100 Gbps or greater Gbps via the twinax pairs 214.

In one embodiment, the processors 208 or 224 can operate to draw or consume power from an independent power source (not shown) located internally, which can be coupled to the circuit board or processor package 216, 230. In addition or alternatively, the signals being transmitted can be used to power the cable. For example, a power signal transmission can be utilized to power the processors for transmission, such as by an electromagnetic coupling or other power signals. A power source from the device coupled to the cable assembly 200 can also be utilized to power the processors 208, 224, such as from an external power source located on an external device coupled to the cable assembly 200 for communicating data.

The processors 208 and 224 can be integrated as transceiver processors that operate to transmit and receive signals for full-duplex transmissions along the twinax pairs 214. In addition or alternatively, the processors 208 and 224 can be coupled to a transmitter, receiver, or transceiver 212, 228 located within the plug assembly 202, 218. For example, a transceiver 212, or 228 can be coupled to the processors on the circuit board 216 or 230 via routed traces or a processor package having connect pads, ball grid array, or other like interconnects mounted on the circuit board 216, 230 (e.g., a printed circuit board) of the cable assembly 200.

The cable assembly 200 can be similar to the cable assembly 100 discussed above, but instead of having a microprocessor on a device board and a connector to the plurality of twin axial cables 214, a microprocessor 208, 224 can be integrated on the head of the twinax cables 214, in which the connection on the head of the microprocessor through the circuit board is the plug or interface 210 or 226 and/or a receiving port, for example. Therefore, the cable side of operation can operate to drive the cable assembly 200 with power drawn or consumed with an integrated mount and package on a substrate (e.g., a semiconductor substrate).

In another embodiment, the cable assembly 200 can include one side having service connections via the board that are coupled to the interconnects 204, 220. One transceiver end (e.g., the plug assembly 202) can be coupled to the twinax pairs or twinax cables 214 (e.g., four twinax copper pairs or eight conductors), in which each pair is bi-directional or a full-duplex communication system to receive one communication protocol while another end converts the communication protocol to another communication protocol in order to standardize a diversity of different communication signals into one signal for use by multiple different ports or jacks for connecting devices. At the other end of the cable assembly 200 (e.g., the plug assembly 218) can operate to decode and also convert back to the first communication protocol based on the type of connecting device or connecting interface 210, 226. The plug assembly 202 or 218 can operate to comply with multiple different standards for communication. One end of the cable assembly can process one communication protocol and the other end a different communication protocol, or both ends the same communication protocol depending upon the mode of operation selected by the processor, the device in which the plug assemblies are interfaced with or connected to, a specification provided by the device connected to the cable assembly 200, a selection of one or more of the twinax pair of twinax pairs for communication, or a selected or desired transmission speed from a selection by the processor or an external device connected via one or more of the interfaces 210 and 226. For example, the plug assembly 202 or 218 can operate in a first mode for a first communication protocol or in a second mode for a different communication protocol of communication, in which one or more of communication data or signals in the communication protocols can be transmitted over eight or less conductors of four or less pairs of twinax cables at 100 Gbps or at greater transmission rates.

In another example, an external device (not shown) can be connected to the cable assembly via the interface 210 and to another external device via the interface 226. The external devices can thus communicate among one another via the cable assembly 200 at a speed of at least 100 Gbps. The twinax pairs 214 can operate to communicate simultaneously at different rates with a first and a second twinax pair communicating speeds of at least 40 Gbps and a third and fourth twinax pair communicating at speeds of at least 10 Gbps so that the cable assembly 200 provides communications between the external devices in the same direction at speeds of at least 100 Gbps. In addition, a full duplex mode of communication is operable for the same speeds (e.g., 100 Gbps or greater) in both directions simultaneously. A communication protocol can be changed for each different communication in order to determine a selection of the speeds. The processor 208 can then process communication across the twinax pairs with different rates for different twinax pairs of the set of twinax pairs 214.

Although the twinax pairs 214 are illustrated as comprising four twinax pairs, a number less than four can also be configured so that physically only two twinax pairs comprise the twinax pairs 214, for example, or, so that only two of three or four twinax pairs are utilized during a communication from one device to another. In addition, the twinax pairs can be reconfigurable so that while a first twinax pair of the twinax pairs 214 communicates at a first speed at a first time (e.g., 40 Gbps), the first twinax pair can communicate at a different speed at a second time (e.g., 10 Gbps). Thus, multi-rate communications can occur across the twinax pairs 214 at the same time and be altered in other communication protocols at other times.

Figure 3:
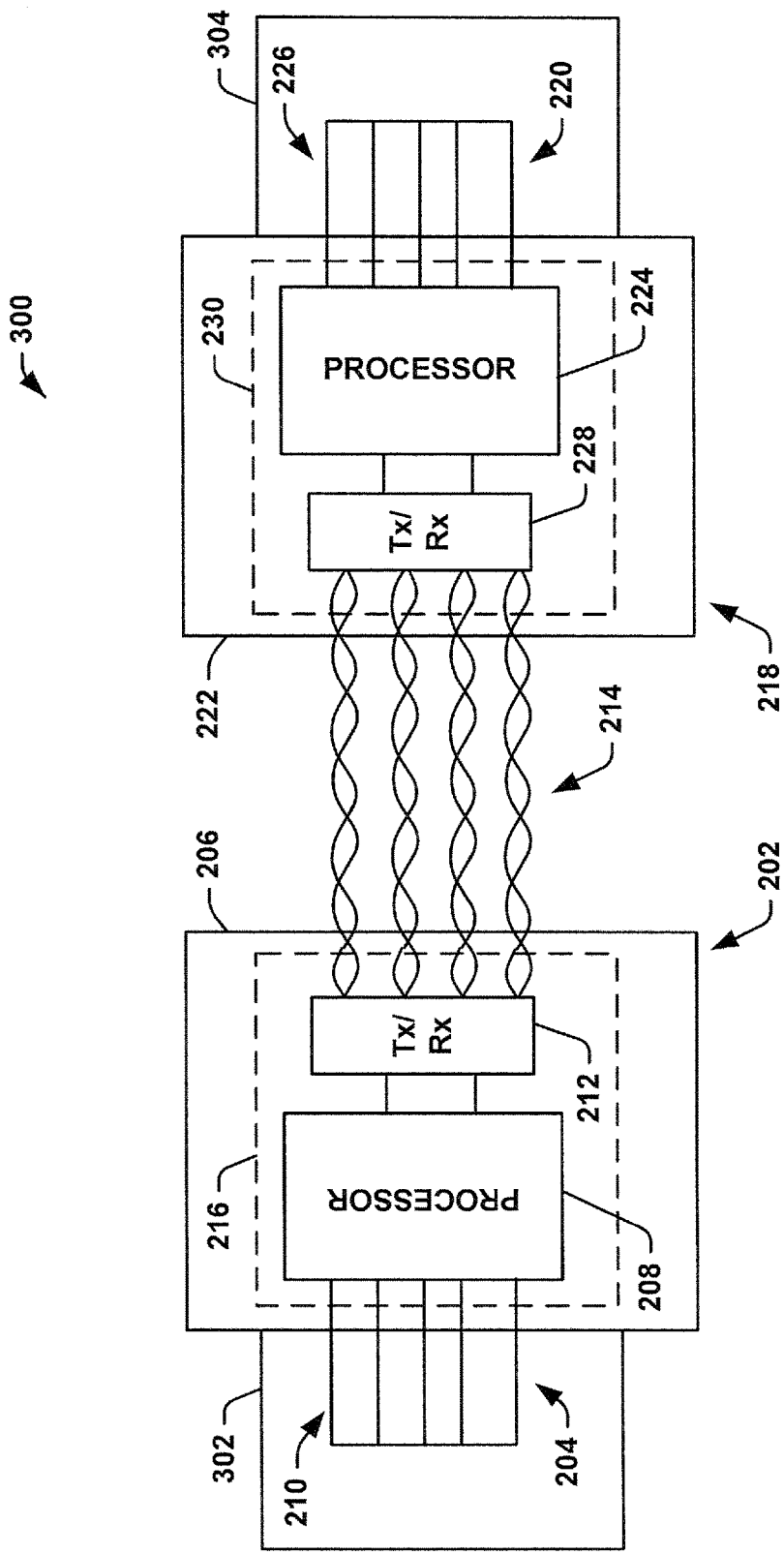
FIG. 3 is a block diagram illustrating another example, non-limiting embodiment of a cable assembly system in accordance with various aspects described herein.

Referring now to FIG. 3, illustrated is an example embodiment of the cable assembly 300 coupled to a plug 302 and a plug 304, which can comprise a receiving port, for example, which can be a Quad Small Form-factor Pluggable (QSFP), a Small Form-Factor Pluggable (SFP) port, a Small Form Factor SFF casing, or the like receiving port. The cable assembly 300 is similar to the cable assemblies discussed above with similar components for operation.

The cable assembly 300 includes interfaces 210 and 226 operate with the surface mount components to join the interconnects 204 and 220 therein with the plug 302 and 304 respectively as a cage and a mate. The plug 302 and 304 can comprise QSFP and/or SFP protocols, which are form factors designed to reduce costs and power consumption, improve reliability and reduce thermal footprint: SFP plus is a small form factor pluggable plus (specified under SFF-8431) and QSFP is quad small form factor pluggable (specified under SFF-8436). Originally intended for an optical form factor, these interfaces can include copper interconnect solutions. The SFP and QSFP form factors are lower power-consuming modules, in which lower power (less heat) increases reliability.

The board 216 comprises the chip or processor 208 mounted at the head of the cable assembly 202, in which the chip or processor 208 is powered through the QSFP connection of the plug and the plug assembly 202, or via a power source of the board 216. The chip can operate as a transceiver chip that is connected to the plurality of twinax cables 214. In one embodiment, the plurality of twinax pairs 214 can comprise different cable assembly configurations that communicate at different transmission rates in a single cable assembly 200 with multi-rate communication transmissions. The plurality of twinax pairs 214 can comprise a first twinax pair, a second twinax pair, a third twinax pair, and a fourth twinax pair, in which each twinax pair can comprise a pair of conductors that can respectively communicate at various transmission rates (e.g., 100 Gbps, 40 Gbps and/or 10 Gbps).

The different communication rates can be specified or selected according to a specification provided within signal communications being transmitted across the twinax pairs 214, a signal via an external device with the plug 302 or 304, or a specification by the processor 208 or 224. A communication protocol could determine the speed or transmission rate for certain twinax pairs, disable some, reconfigure the rate for one or more, or transmit rates at one speed across one twinax pair and another speed across another twinax pair 214 for example. As stated above, multiple different standards can be transmitted over the same cable and/or different twinax pairs with various pin connections or trace connections for different twinax pairs. Each plug, for example, can comprise a clock (not shown) for re-timing or re-clocking different signals also. The assembly 202 and 218 can comprise balun connectors for the twinax pairs and/or other interfaces, for example, such as a Medium Dependent Interface (MDI), PMDA, SERDES, etc.

Figure 4:
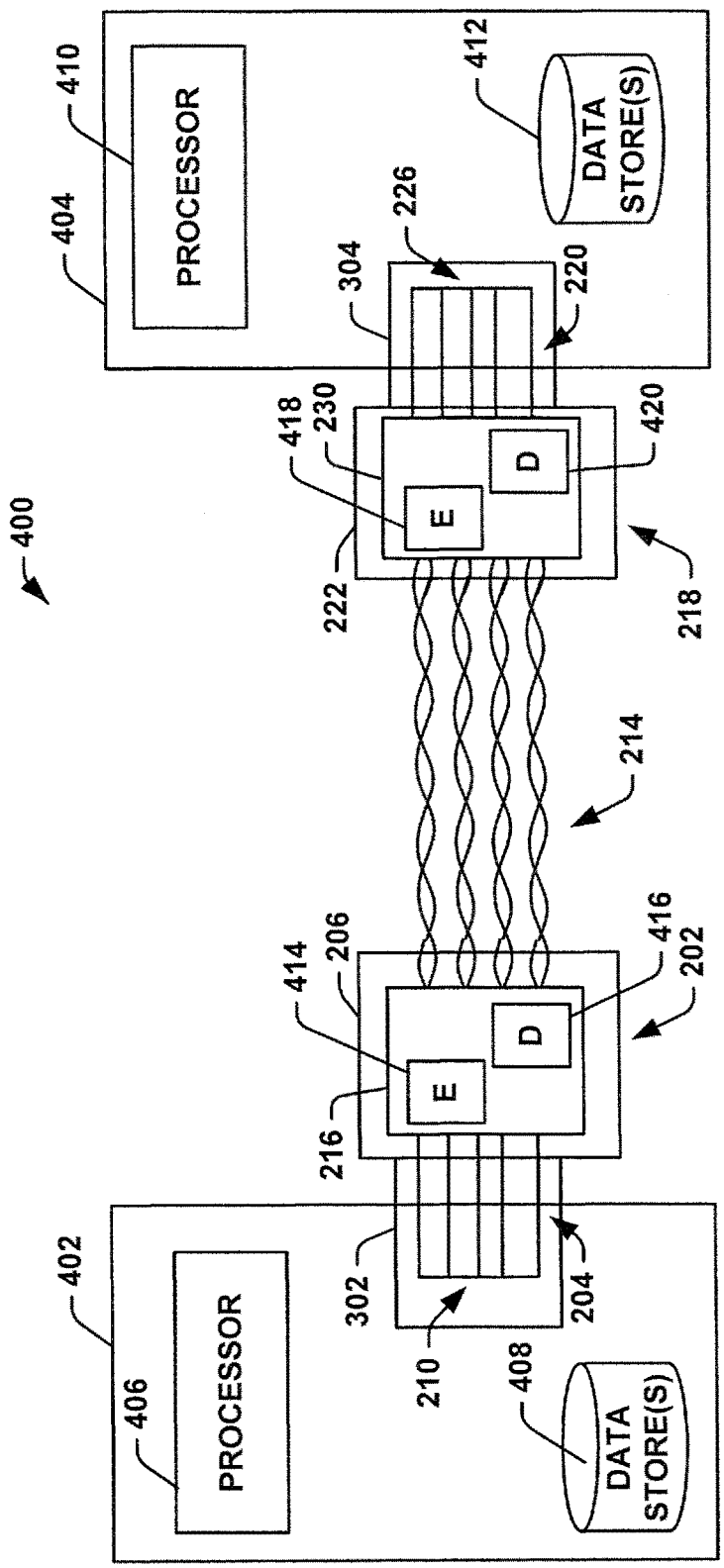
FIG. 4 is a block diagram illustrating another example, non-limiting embodiment of a cable assembly system in accordance with various aspects described herein.

Referring now to FIG. 4, illustrated is an example of a cable assembly 400 that operates at high speed transmission for transmitting and receiving data back and forth from one or more devices at different or multiple transmission rates concurrently or simultaneously. A cable assembly 400 comprises similar components as discussed above and further includes encoding components and decoding components mounted on a surface mount or circuit board within the plug assemblies 202 and 218

The cable assembly 400 is operatively coupled to a first device 402 and a second device 404 via the reduced set of twinax pairs 214 at speeds of 100 Gbps or greater. The first device 402 or the second device 404 can respectively comprise a processor 406, 410 and one or more data stores 408 and 412. The first device 402 or the second device 404 can comprise a processing device such as a personal computer device, a mobile device, an input/output device, a display, a personal digital assistant, or other similar device operable for communicating via the plug 302 or 304.

The surface mount or electronic board 216, 230 of the plug assemblies 202 and 218 at opposite ends of the twinax pairs 214 can comprise encoders 414 and 418 and decoders 416 and 420 respectively that are operatively coupled to a processor and/or transceiver architectures on the circuit boards or mounting assemblies 216, 230. The encoder 414, for example, can operate to convert at least a part of information of signals from one format, code or communication protocol to another via one or more algorithms based on a selection of a communication protocol. For example, the selection can be predetermined or dynamic based on the type of devices coupled to the cable assembly 400. The communication protocol (e.g., a Universal Serial Bus standard, a Peripheral Component Interconnect Express standard, a Display Port standard, High-Definition Multimedia Interface, S-Video, RCA, etc.), for example, can be based on a specification or a determination by the device of the one or more signals, a communication protocol of the one or more signals, a device communication protocol of the first device or the second device coupled to one or more ends of the reduced set of twinax pairs 214, and/or a selection of a twinax pair of the reduced set of twinax pairs, which can be specified by a processor (e.g., 208, 224 discussed supra) of the cable assembly 400.

The decoder 416 or 420 can operate to reverse the operation of the encoder in order to convert the information from one format or protocol into the original format or protocol. For example, the decoder 416 or 420 can operate to convert binary information from a number of lines to a unique output lines. For example, in cases where one or more encoders encode data from the first device 402 into one format for high speed transmission, the plug assembly 218 can operate to decode and/or re-code the data based on the second device 404 being a different device operating in a different communication protocol.

In one embodiment, the twinax pairs 214 comprise only four or less pairs of conductors for communicating over twinax cables at a transmission rate of 100 Gbps or greater and at different or varied transmission rates for each twinax pair. In one example, the cable assembly 400 comprises the plurality of twinax cables 214 that operate at multi-rate transmission speeds. The plurality of twinax pairs can comprise a first twinax pair and a second twinax pair that operate at multi-rate transmissions or at different transmission rates respectively. In addition, a third and a four twinax pair can also operate for transmission speeds different from the first and second twinax pairs or different from one another. For example, the first twinax pair can operate within the cable assembly at speeds of at least forty Gbps rate and the second twinax pair can operate at speeds of at least ten Gbps rate. The third and four twinax pair can operate at speeds of at least 40 Gbps and 10 Gbps. Alternatively, the first and second twinax pair can operate at speeds of at least 40 Gbps and the third and fourth can operate at speeds of at least 10 Gbps. The cable assembly can also operate as an active assembly that draws or consumes power similar to that discussed above.

The plurality of twinax pairs comprising the first twinax pair and the second twinax pair, for example, can comprise an active copper, in which rather than four pairs both of the twinax pairs (first and second) can be two twinax cables that are operable as full-duplex transmission lines that are two directional with 40 Gbps and 10 Gbps transmission speeds. The cable assembly therefore has twinax pairs that can have two pairs of conductors operating at 40 Gbps, and two 10 Gbps, and/or one 100 Gbps cable assembly.

Figure 5:
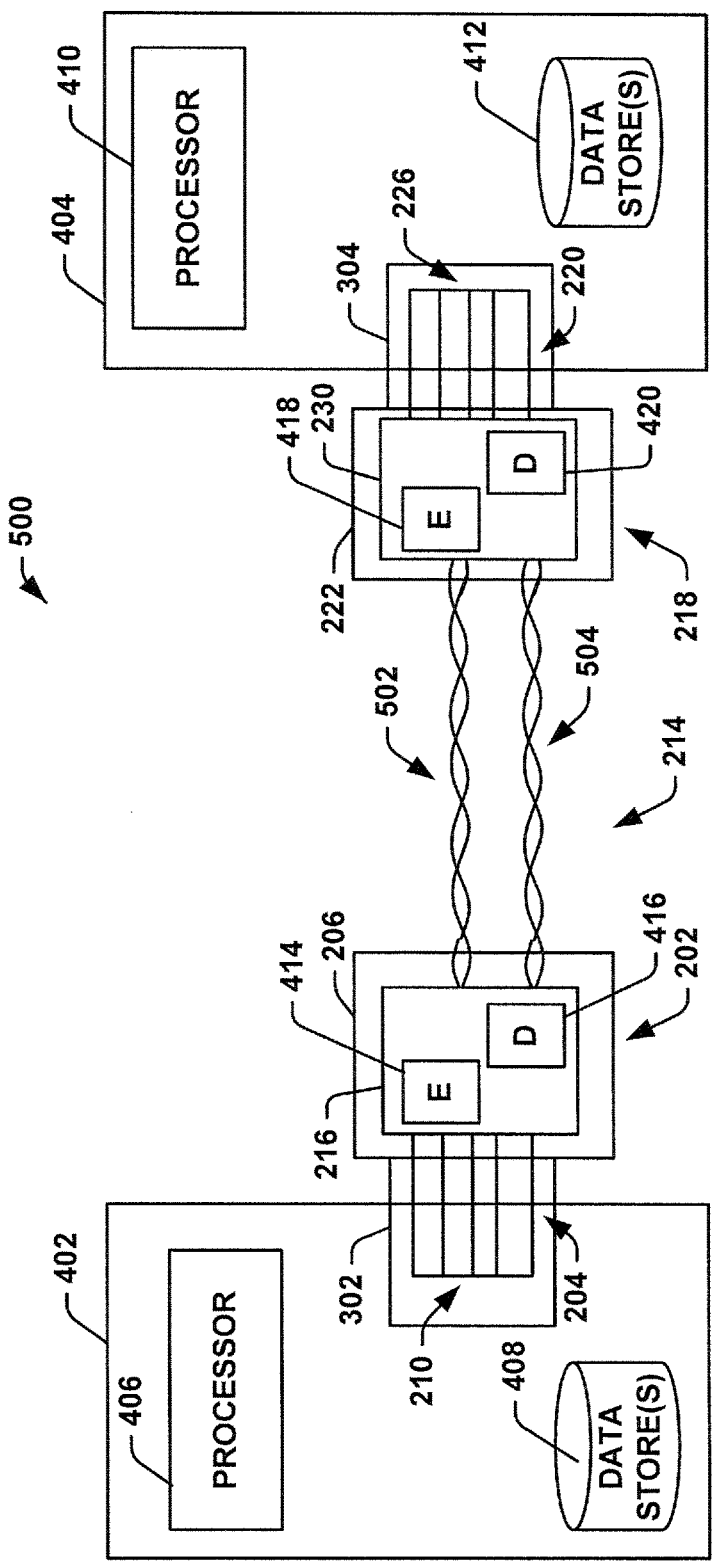
FIG. 5 is a block diagram illustrating another example, non-limiting embodiment of a cable assembly system in accordance with various aspects described herein.

Referring to FIG. 5, illustrated is another example of a cable assembly 500 comprising a set of twinax pairs for communicating at multiple different transmission rates concurrently. The cable assembly 500 comprises similar components as discussed above. The set of twinax pairs 214 comprises at least two twinax pairs that each can comprise at least two conductors each for a full duplex mode of transmission.

The set of twinax pairs 214 can comprise a first twinax pair 502 and a second twinax pair 504, for example. The first twinax pair 502 can operate to communicate data at a first speed and the second twinax pair 504 can operate to communicate data concurrently or simultaneously at a different speed. In one aspect, the first twinax pair 502 can communicate at a speed of at least 40 Gbps and the second twinax pair 504 can operate to communicate data at a speed of at least 10 Gbps. The twinax pairs 502 and 504 can be switched to communicate at the same speed, or at different speeds than initially so that the first twinax pair is reconfigured to communicate from 40 Gbps to 10 Gbps, or vice versa, from 10 Gbps to 40 Gbps.

Figure 6:
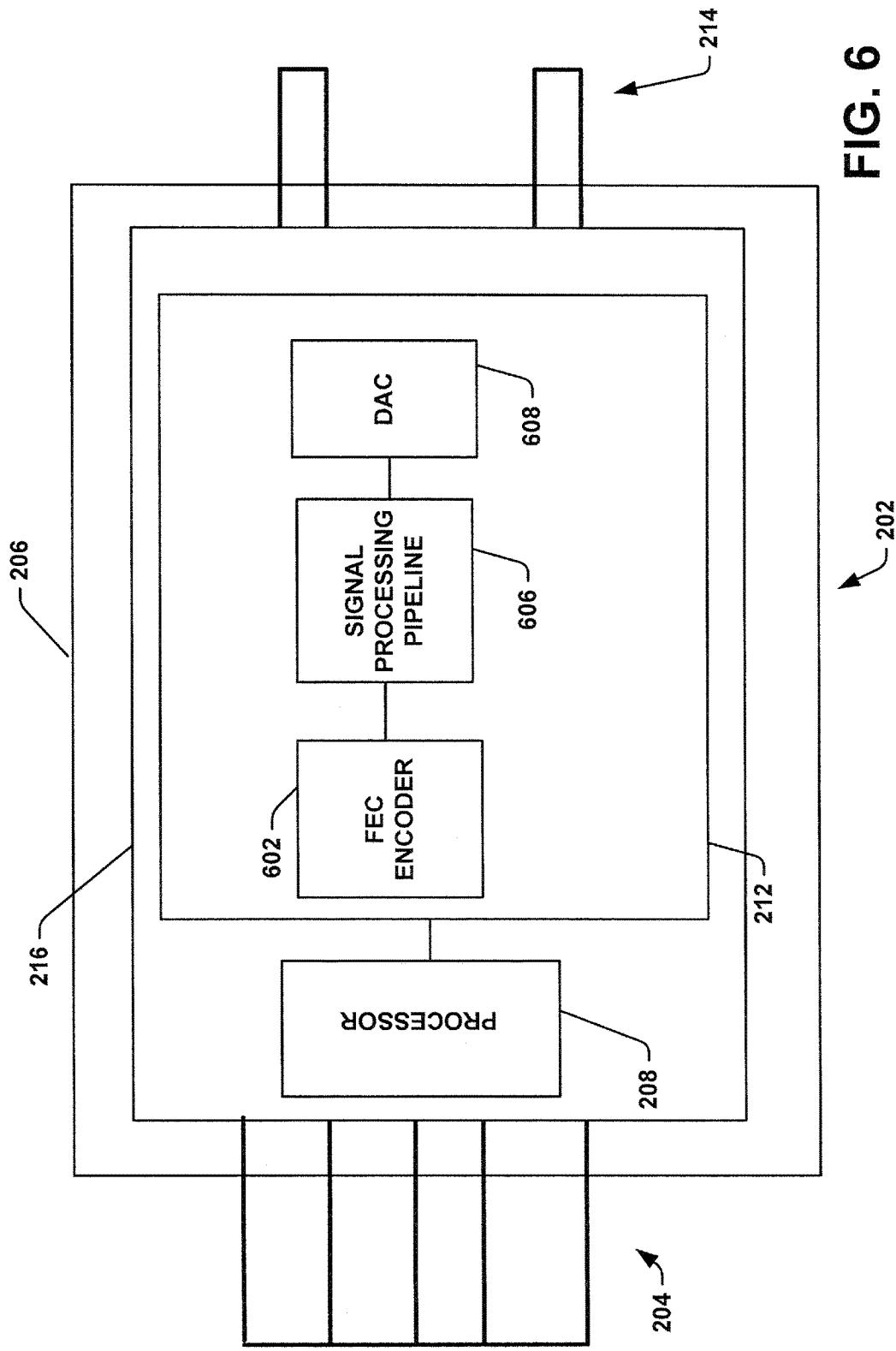
FIG. 6 is a block diagram illustrating an example, non-limiting embodiment of a transceiver system in accordance with various aspects described herein.
Figure 7:
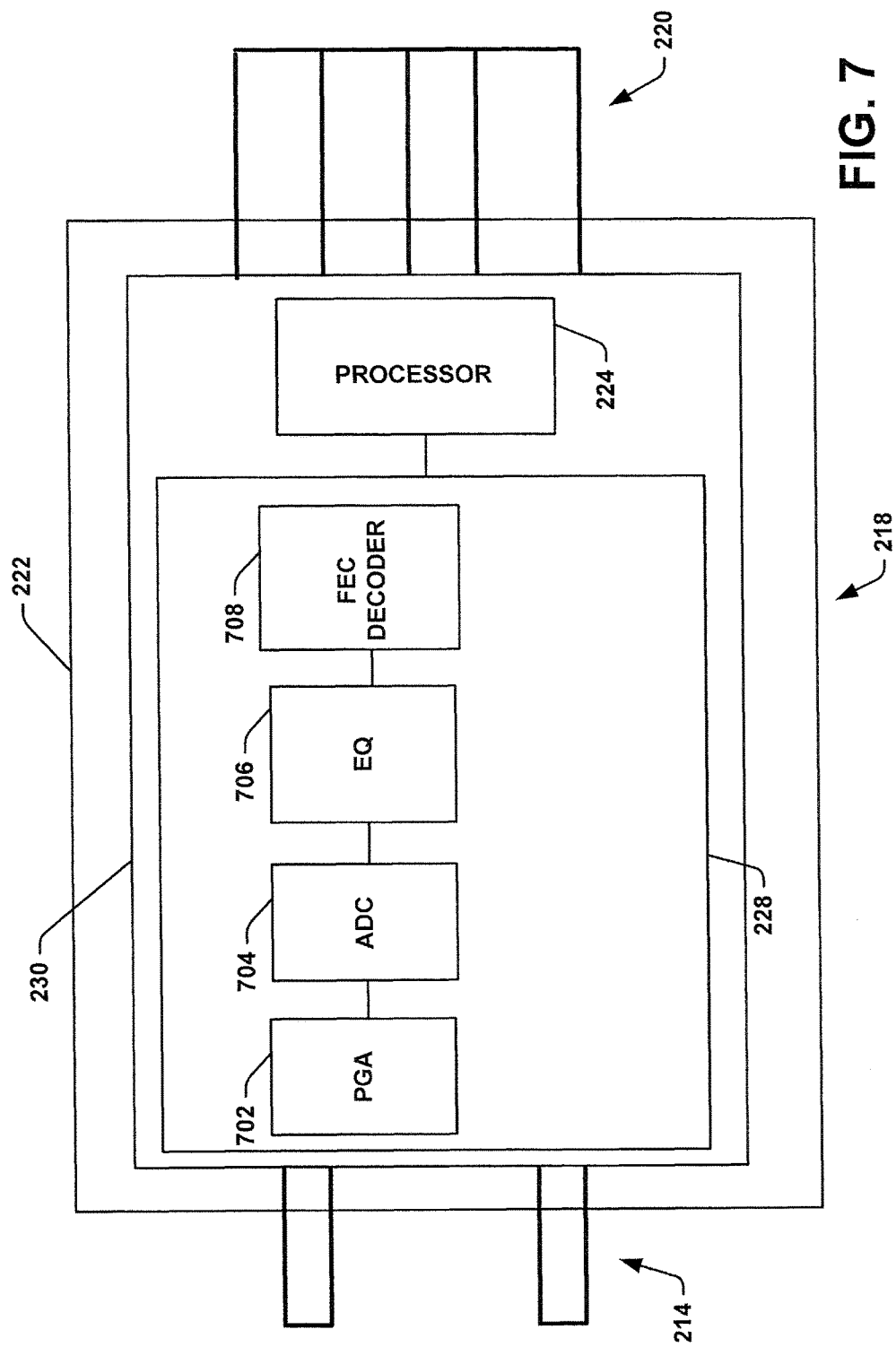
FIG. 7 is a block diagram illustrating another example, non-limiting embodiment of a transceiver system in accordance with various aspects described herein.

Referring now to FIG. 6 and FIG. 7 together, illustrated are further aspects of transceiver architectures for the cable assemblies discussed in this disclosure. FIG. 6, for example, illustrates the plug assembly 202 having a transceiver architecture for transmission of encoded data at high transmission speeds (e.g., 80 Gbps or 100 Gbps, and greater) and at different transmission rates across a set of twinax pairs 214 comprising four or less twinax pairs, for example. FIG. 7, for example, illustrates the plug assembly 202 having a transceiver architecture for receiving of encoded data at high transmission speeds (e.g., 80 Gbps or 100 Gbps, and greater) and at different transmission rates at each twinax pair (e.g., 100 Gbps, 40 Gbps, or 10 Gbps). These illustrations are examples for the sake of explanation and the architectures discussed can be comprised by both plug assemblies 202 and 218, or comprised in opposite plug assemblies 218 and 202 for a communication encoding and decoding in the opposite direction.

In one aspect, FIG. 6 illustrates similar components as discussed above with the transceiver component 212 comprising a Forward Error Correction (FEC) encoder 602, a signal processing pipeline 606 and a Digital-to-Analog Converter (DAC) 608. The FEC encoder 602 operates to encoded data received and to transmit most significant bits, for example, to a signal processing pipeline 506, which can include one or more processing components for processing signals concurrently. The signal processing pipeline 606, for example, can include a mapper that receives signals over a set of bit stream pathways (e.g., three connections) and assimilates the data to output a set of symbols for transmission across the channel (e.g., the twinax pairs 214). The DAC 508 converts the digital signal to an analog signal for transmission.

In another aspect, FIG. 7 illustrates similar components discussed above also with the transceiver component 228 comprising a programmable gain amplifier (PGA) 702, an Analog-to-Digital Converter (ADC) 704, an equalizer component 706, and an FEC Decoder 708. The twinax pairs 214 communicate (transmit and receive) in a full-duplex mode of transmission to and from the transceiver component 228. The signal can be amplified by the PGA 702, converted from analog to digital by the ADC 704, equalized by the equalizer 706 and further decoded by the FEC decoder 708 for 80 Gbps or 100 Gbps and greater transmissions.

Example Methods of Multi-Rate Transmission Over Reduced Pairs of Twinax Cables

While the methods or process flows described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
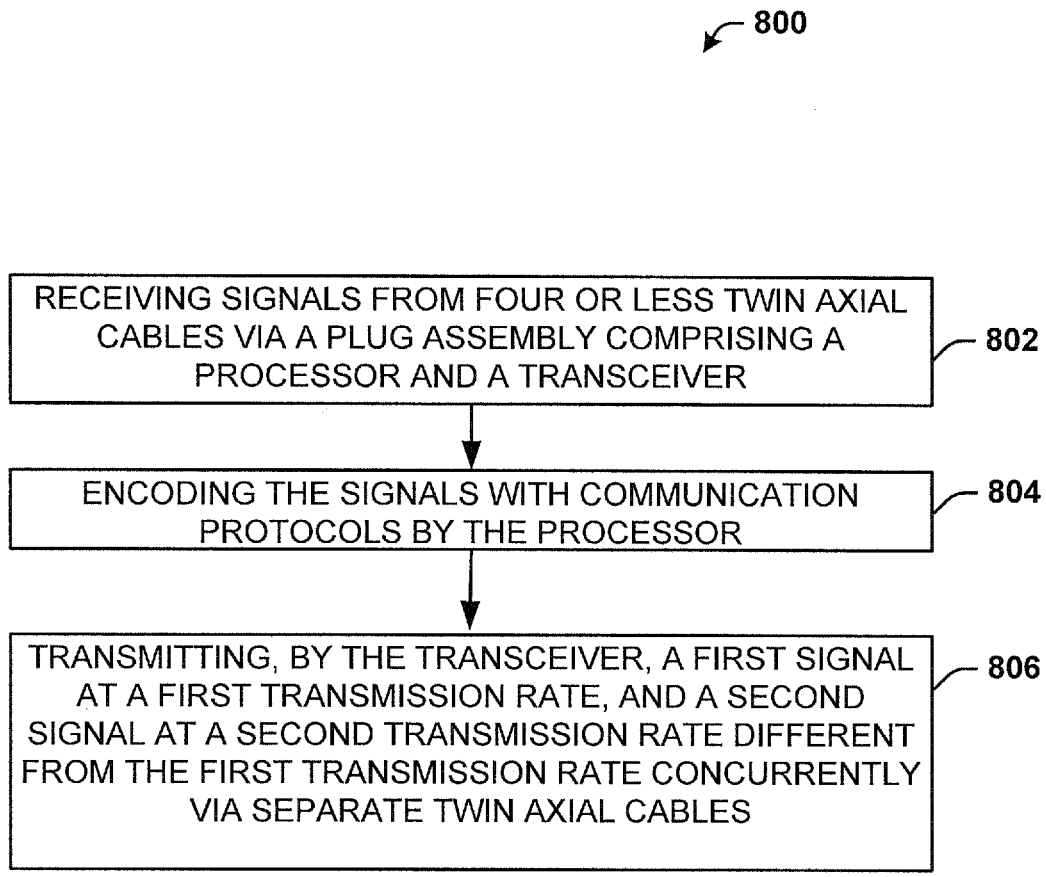
FIG. 8 illustrates a flow diagram of a non-limiting embodiment for a cable assembly system in accordance with various aspects described herein.

An example method 800 for a cable assembly to transmit and receive communication data at high speed transmissions and multiple different transmission speeds across twinax pairs of a reduced set of twinax pairs is illustrated in FIG. 8. At 802, the method 800 comprises receiving signals from four or less twin axial cables via a plug assembly comprising a processor and a transceiver. The twinax pairs are reduced to four or less pairs of twin axial conductors, such as twin axial copper conductors that enable full-duplex communication between different end devices via the twinax pairs. A cable assembly is operable at 80 Gbps or greater, such as at 100 Gbps transmission rates or greater for transmission of signals in full duplex communication modes and at different transmission rates along different twinax pairs of the same cable assembly integrated for communications of different modes, standards or speeds between a first device and a second device.

The cable assembly can be integrated with a housing or plug assembly at each end comprising a circuit board or surface mount with a processor for processing different transmission speeds along the set of twinax pairs. The twinax pairs can comprise a cable assembly that forms a single transmission unit with processing devices, which can be function independently as part of the cable assembly and of any two devices being linked by the cable assembly. The twinax pairs can communicate at one speed within the cable assembly as well as different speeds along different twinax pairs that form the set of twinax pairs, which can comprise four or less twinax pairs and at least two twinax pairs (e.g., two, three or four twinax pairs).

For example, one or more signals to be communicated can be received via the plug assembly having a processor at one end of the cable assembly integrated with a surface mount and the twinax pair ends, which can be coupled to or connected to the surface mount. The signals can be generated from one device to be communicated at a desired or selected rate over the cable assembly of twinax pairs to another device at different rates of speed at the same time.

Based on the standard of communication, a selected mode of communication, or a transmission protocol implemented by the processor within the plug assembly of the cable assembly, the signals can be encoded and communicated at different speeds along different twinax pairs at the same time to achieve the desired speed, for example At 804, the method comprises encoding the signals with communication protocols by the processor. The encoding can further comprise encoding at least a portion of the one or more signals in a second communication protocol to transmit the one or more signals from the first device and to the second device at multiple different rates simultaneously. The method 800 can also include selecting which protocol from among the first communication protocol and the second communication protocol to encode the at least the part of the one or more signals. For example, the selecting can be based on at least one of a specification or parameter (e.g., based on the port or plug of a device, such as USB, Ethernet, etc.) of the one or more signals, a communication protocol of the one or more signals, a device communication protocol or standard of the first device or the second device coupled to one or more ends of the reduced set of twinax pairs, or a selection of a twinax pair of the reduced set of twinax pairs for communicating at one speed and another twinax pair for communication at the same time at a different speed.

At 806, the transceiver transmits a first signal at a first transmission rate, and a second signal at a second transmission rate different from the first transmission rate concurrently via separate twin axial cables.

In one embodiment, integrating the reduced set of twinax pairs with the processor and the transceiver of the plug assembly can comprise integrating four or less twin axial cables that respectively comprise a pair of twinax conductors with a microprocessor package assembly having a mounting assembly to a circuit board. Receiving and transmitting the one or more signals can comprise communicating the one or more signals in a full-duplex communication simultaneously in different directions between a first device and a second device.

Figure 9:
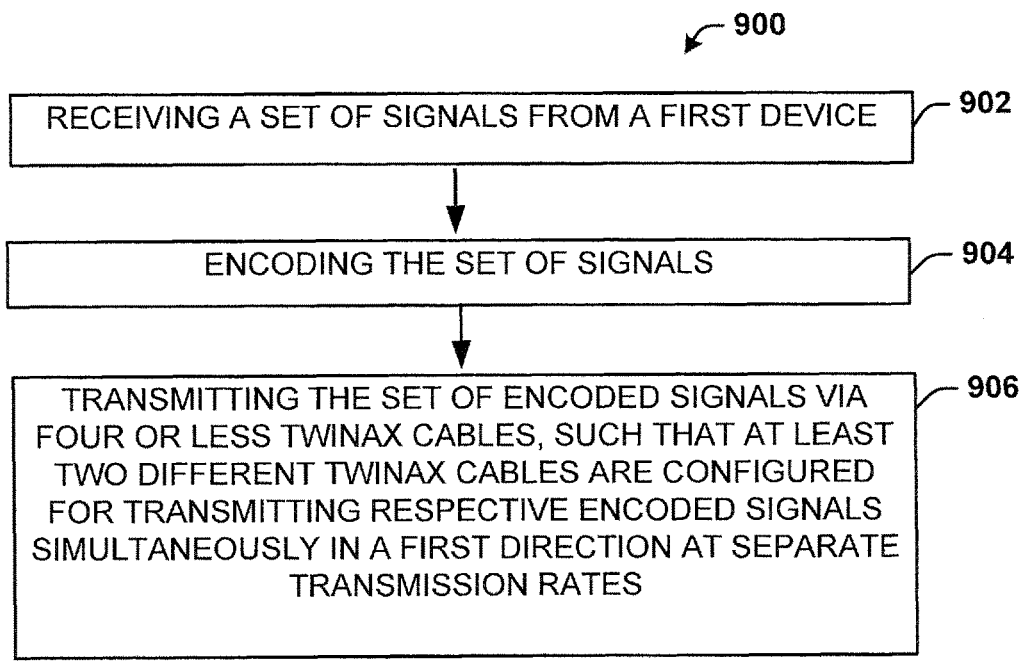
FIG. 9 illustrates a flow diagram of another non-limiting embodiment for a cable assembly system in accordance with various aspects described herein.

Referring now to FIG. 9, illustrated is a method 900 for a cable assembly operable to communicate data at 100 Gbps or greater and at different or multiple rates concurrently over a set of full duplex twin axial pairs. For example, four or less cables each having a twinax pair or pair of twin axial conductors, such as copper conductors or conductors of another alloy can operate to transmit and receive signals in a full-duplex communication mode at increased rates of 100 Gigabytes per second or greater with one pair of twinax pairs communication at a first rate (e.g., at least 40 Gbps) and a second pair of twinax pairs communicating at a second rate (e.g., at least 10 Gbps).

At 902, twinax pairs can be integrated into a plug assembly of a cable assembly at both ends of the twinax cable pairs. For example, a processor can be includes at each plug assembly end that processes, encodes, decodes and/or selects a communication mode or protocol for transmitting and receiving signals via different twinax pairs at the same time from one device to another. Data can be communicated, for example, from a first device via eight or less conductors (e.g., copper conductors) that form four or less twinax pairs for a full duplex communication mode in a twin axial cable assembly at 100 Gigabytes per second or less.

At 904, the set of signals can be encoded for communication from a first device to a second device, and/or vice versa, in response to one or more plug assemblies of the twinax pairs receiving one or more signals from a first or a second device. At 906, the method transmitting the set of encoded signals via four or less twinax cables, such that at least two different twinax cables are configured for transmitting respective encoded signals simultaneously in a first direction at separate transmission rates. In addition, signals can be sent in the opposite direction to the first direction simultaneously at different or multiple transmission rates.

Example Computing Environment

Figure 10:
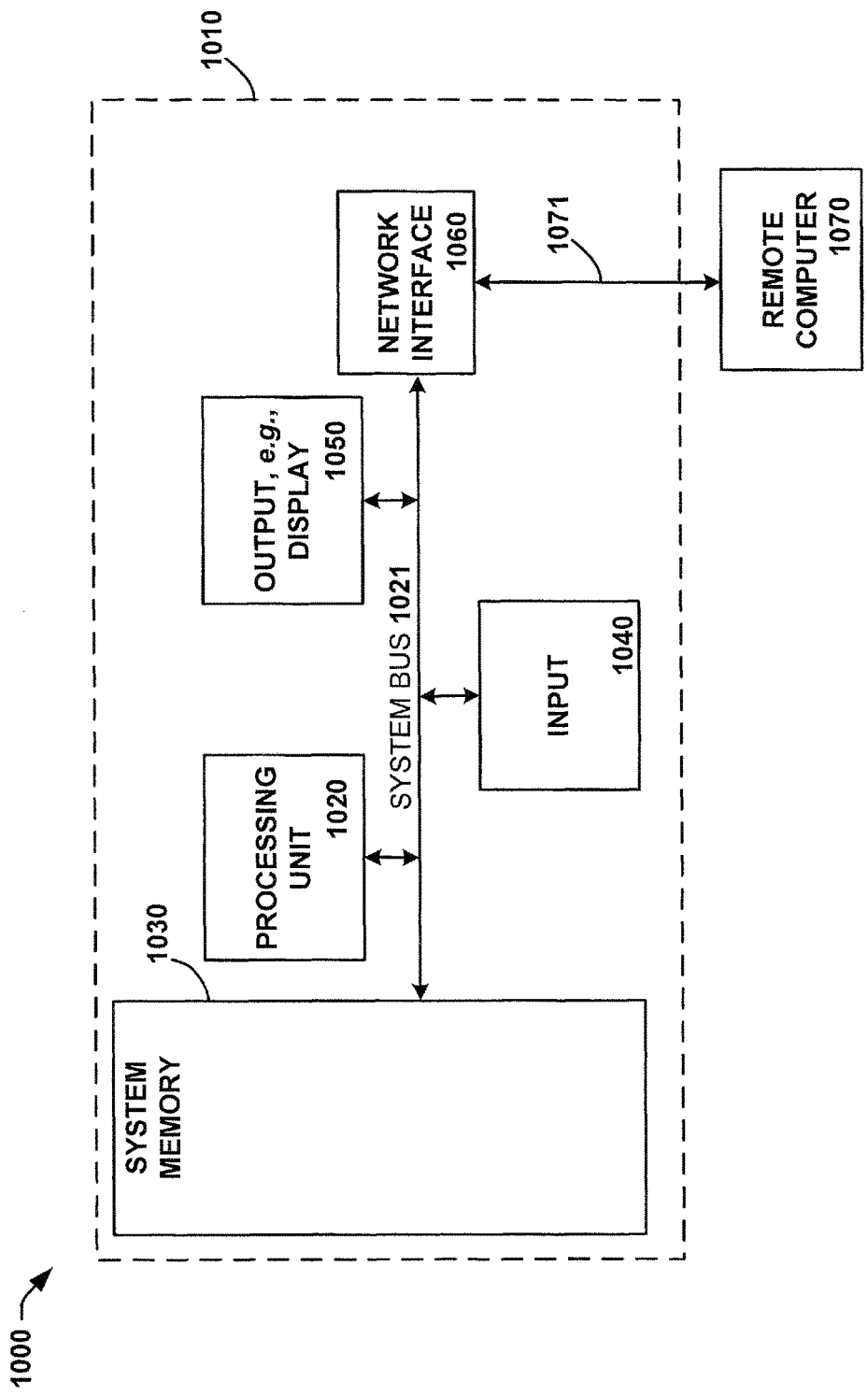
FIG. 10 illustrates a block diagram of an example electronic computing environment that can be implemented in conjunction with one or more aspects described herein.

As mentioned, advantageously, the techniques described herein can be applied to any device and/or network where power management is desirable in a multiprocessor system. It is to be understood, therefore, that handheld, portable and other computing devices and computing objects of all kinds are contemplated for use in connection with the various non-limiting embodiments, i.e., anywhere that a device may wish to implement power management for a multiprocessor system. Accordingly, the below general purpose remote computer described below in FIG. 10 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 10 thus illustrates an example of a suitable computing system environment 1000 in which some aspects of the disclosed subject matter can be implemented, although as made clear above, the computing system environment 1000 is only one example of a suitable computing environment for a device and is not intended to suggest any limitation as to the scope of use or functionality of the disclosed subject matter. Neither should the computing environment 1300 be interpreted as having any dependency or requirement relating to any one or combination of components illustrated in the exemplary operating environment 1000.

With reference to FIG. 10, an exemplary device for implementing the disclosed subject matter includes a general-purpose computing device in the form of a computer 1010. Components of computer 1010 may include, but are not limited to, a processing unit 1020, a system memory 1030, and a system bus 1021 that couples various system components including the system memory to the processing unit 1020. The system bus 1021 may be any of several types of bus structures including a memory bus or memory controller, a peripheral bus, and a local bus using any of a variety of bus architectures.

Computer 1010 typically includes a variety of computer readable media. Computer readable media can be any available media that can be accessed by computer 1010. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1010. Communication media typically embodies computer readable instructions, data structures, program modules, or other data in a modulated data signal such as a carrier wave or other transport mechanism and includes any information delivery media.

The system memory 1030 may include computer storage media in the form of volatile and/or nonvolatile memory such as read only memory (ROM) and/or random access memory (RAM). A basic input/output system (BIOS), containing the basic routines that help to transfer information between elements within computer 1010, such as during start-up, may be stored in memory 1030. Memory 1030 typically also contains data and/or program modules that are immediately accessible to and/or presently being operated on by processing unit 1020. By way of example, and not limitation, memory 1030 may also include an operating system, application programs, other program modules, and program data.

The computer 1010 may also include other removable/non-removable, volatile/nonvolatile computer storage media. For example, computer 1010 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1021 through a non-removable memory interface such as an interface, and a magnetic disk drive or optical disk drive is typically connected to the system bus 1021 by a removable memory interface, such as an interface.

A user can enter commands and information into the computer 1010 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1020 through user input 1040 and associated interface(s) that are coupled to the system bus 1021, but may be connected by other interface and bus structures, such as a parallel port, game port, or a universal serial bus (USB). A graphics subsystem can also be connected to the system bus 1021. A projection unit in a projection display device, or a HUD in a viewing device or other type of display device can also be connected to the system bus 1021 via an interface, such as output interface 1050, which may in turn communicate with video memory. In addition to a monitor, computers can also include other peripheral output devices such as speakers which can be connected through output interface 1050.

The computer 1010 can operate in a networked or distributed environment using logical connections to one or more other remote computer(s), such as remote computer 1070, which can in turn have media capabilities different from device 1010. The remote computer 1070 can be a personal computer, a server, a router, a network PC, a peer device, personal digital assistant (PDA), cell phone, hand-held computing device, a projection display device, a viewing device, or other common network node, or any other remote media consumption or transmission device, and may include any or all of the elements described above relative to the computer 1010. The logical connections depicted in FIG. 10 include a network 1071, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1010 can be connected to the LAN 1071 through a network interface or adapter. When used in a WAN networking environment, the computer 1010 can typically include a communications component, such as a modem, or other means for establishing communications over the WAN, such as the Internet. A communications component, such as wireless communications component, a modem and so on, which can be internal or external, can be connected to the system bus 1021 via the user input interface of input 1040, or other appropriate mechanism. In a networked environment, program modules depicted relative to the computer 1010, or portions thereof, can be stored in a remote memory storage device. It will be appreciated that the network connections shown and described are exemplary and other means of establishing a communications link between the computers can be used.

Example Networking Environment

Figure 11:
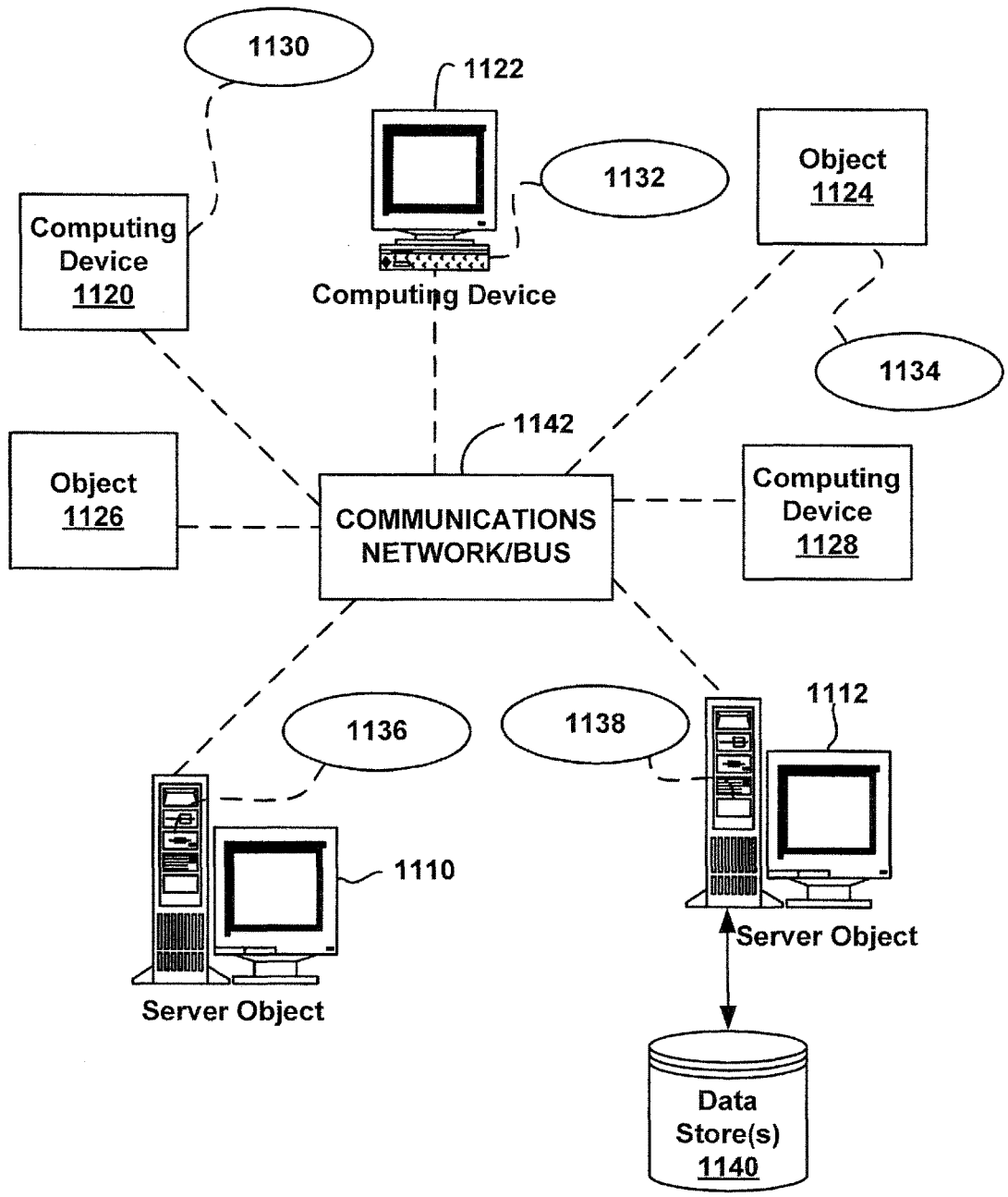
FIG. 11 illustrates a block diagram of an example data communication network that can be operable in conjunction with various aspects described herein.

FIG. 11 provides a schematic diagram of an exemplary networked or distributed computing environment. The distributed computing environment comprises computing objects 1110, 1112, etc. and computing objects or devices 1120, 1122, 1124, 1126, 1128, etc., which may include programs, methods, data stores, programmable logic, etc., as represented by applications 1130, 1132, 1134, 1136, 1138 and data store(s) 1140. It can be appreciated that computing objects 1110, 1112, etc. and computing objects or devices 1120, 1122, 1124, 1126, 1128, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1140 can include one or more cache memories, one or more registers, or other similar data stores disclosed herein.

Each computing object 1110, 1112, etc. and computing objects or devices 1120, 1122, 1124, 1126, 1128, etc. can communicate with one or more other computing objects 1110, 1112, etc. and computing objects or devices 1120, 1122, 1124, 1126, 1128, etc. by way of the communications network 1142, either directly or indirectly. Even though illustrated as a single element in FIG. 11, communications network 1142 may comprise other computing objects and computing devices that provide services to the system of FIG. 11, and/or may represent multiple interconnected networks, which are not shown. Each computing object 1110, 1112, etc. or computing object or devices 1120, 1122, 1124, 1126, 1128, etc. can also contain an application, such as applications 1130, 1132, 1134, 1136, 1138, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 11, as a non-limiting example, computing objects or devices 1120, 1122, 1124, 1126, 1128, etc. can be thought of as clients and computing objects 1110, 1112, etc. can be thought of as servers where computing objects 1110, 1112, etc., acting as servers provide data services, such as receiving data from client computing objects or devices 1120, 1122, 1124, 1126, 1128, etc., storing of data, processing of data, transmitting data to client computing objects or devices 1120, 1122, 1124, 1126, 1128, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1142 or bus is the Internet, for example, the computing objects 1110, 1112, etc. can be Web servers with which other computing objects or devices 1120, 1122, 1124, 1126, 1128, etc. communicate via any of a number of known protocols, such as the hypertext transfer protocol (HTTP). Computing objects 1110, 1112, etc. acting as servers may also serve as clients, e.g., computing objects or devices 1120, 1122, 1124, 1126, 1128, etc., as may be characteristic of a distributed computing environment.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Unless otherwise indicated, all numbers, values and/or expressions referring to characteristics (e.g. speed) used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A cable assembly, comprising:
four or less twin axial cables configured for communicating signals in opposite directions;
a plug assembly configured for associating one end of the four or less twin axial cables with an interconnect, and connecting another end with an interface port, wherein the plug assembly comprising:
a transceiver configured for communicating the signals, respectively, in the opposite directions to and from the interface port, wherein the transceiver transmits a first signal of the signals at a first transmission rate and simultaneously transmits a second signal of the signals at a second transmission rate via the four or less twin axial cables, and wherein the second transmission rate is different from the first transmission rate; and
a processor operatively coupled to the transceiver that is configured for digital signal processing of the signals via the four or less twin axial cables, the processor being integrated on a head of a twin axial cable of the four or less twin axial cables and connected to the interconnect to facilitate connecting the twin axial cable to the interconnect, the interconnect facilitating connecting the twin axial cable and the processor with a circuit board associated with the interconnect.

2. The cable assembly of claim 1, wherein the four or less twin axial cables are configured to comprise a set of conductors comprising not more than eight conductors, the not more than eight conductors being configured for communicating the signals at a speed of at least one hundred gigabytes per second.

3. The cable assembly of claim 2, wherein the four or less twin axial cables comprise a single, full duplex twin axial cable.

4. The cable assembly of claim 1, wherein the first transmission rate is at least forty gigabytes per second and is associated with a first twin axial cable of the four or less twin axial cables, and the second transmission rate is at least ten gigabytes per second and is associated with a second twin axial cable of the four or less twin axial cables.

5. The cable assembly of claim 4, wherein the four or less twin axial cables comprise a third twin axial cable configured for communicating a third signal at a third transmission rate of at least forty gigabytes per second and a fourth twin axial cable configured for communicating a fourth signal at a fourth transmission rate of at least ten gigabytes per second.

6. The cable assembly of claim 1, wherein the processor is configured to transmit the signals at different transmission rates simultaneously via the four or less twin axial cables with a surface mount assembly that is coupled to the transceiver.

7. The cable assembly of claim 1, wherein the four or less twin axial cables are configured to transmit the signals in the opposite directions at different transmission rates by encoding the signals in a first communication protocol based on the first transmission rate and a second communication protocol based on the second transmission rate.

8. The cable assembly of claim 1, wherein the four or less twin axial cables are configured to transmit the signals at a speed of at least one hundred fifty gigabytes per second, and the processor is communicably integrated to the plug assembly via connections from a processor package mount.

9. A signal processing method comprising:
receiving signals from four or less twin axial cables via a plug assembly comprising a processor and a transceiver;
encoding, by the processor, the signals with communication protocols to generate encoded signals; and
concurrently transmitting, by the transceiver, a first encoded signal of the encoded signals at a first transmission rate and a second encoded signal of the encoded signals at a second transmission rate that is different from the first transmission rate via separate twin axial cables of the four or less twin axial cables, the processor being integrated on a head of a first twin axial cable of the four or less twin axial cables and connected to an interconnect to facilitate connecting the first twin axial cable to the interconnect, the interconnect facilitating connecting the first twin axial cable and the processor with a circuit board associated with the interconnect and the transceiver.

10. The method of claim 9, wherein the first transmission rate is at least one hundred gigabytes per second.

11. The method of claim 9, wherein the concurrently transmitting the first encoded signal at the first transmission rate and the second encoded signal at the second transmission rate comprises concurrently communicating the first encoded signal via the first twin axial cable at a speed of at least forty gigabytes per second and communicating the second encoded signal via a second twin axial cable of the four or less twin axial cables at a speed of at least ten gigabytes per second.

12. The method of claim 9, wherein the concurrently transmitting the first encoded signal at the first transmission rate and the second encoded signal at the second transmission rate comprises concurrently transmitting the first encoded signal at the first transmission rate via the first twin axial cable and the second encoded signal at the second transmission rate via a second twin axial cable of the four or less twin axial cables, the first transmission rate and the second transmission rate respectively being at least forty gigabytes per second, and wherein the method further comprises:
communicating a third encoded signal of the encoded signals via a third twin axial cable of the four or less twin axial cables and a fourth encoded signal of the encoded signals via a fourth twin axial cable of the four or less twin axial cables at respective transmission rates of at least ten gigabytes per second.

13. The method of claim 9, further comprising:
encoding a first signal in a first communication protocol to facilitate transmitting the first encoded signal at the first transmission rate via the first twin axial cable and a second signal in a second communication protocol to facilitate simultaneously transmitting the second encoded signal at the second transmission rate via a second twin axial cable of the four or less twin axial cables.

14. The method of claim 9, further comprising:
determining, by the processor of the plug assembly, whether to encode a signal of the signals using a first communication protocol or a second communication protocol based on a data transmission speed.

15. A transceiver device comprising:
a memory to store computer-executable instructions; and
a processor, coupled to the memory, that facilitates execution of the computer-executable instructions to perform operations, comprising:
receiving a set of signals from a first device;
encoding the set of signals to generate a set of encoded signals; and
transmitting the set of encoded signals via four or less twin axial cables, comprising a first twin axial cable and a second twin axial cable, the first twin axial cable being configured for transmitting a first encoded signal of the set of encoded signals in a first direction at a first transmission rate and the second twin axial cable being configured for transmitting a second encoded signal of the set of encoded signals in the first direction at a second transmission rate simultaneously with the transmitting of the first encoded signal, and the second transmission rate being different from the first transmission rate, wherein a second processor is integrated with a head of the first twin axial cable and connected to an interconnect to facilitate connecting the first twin axial cable to the interconnect, the interconnect facilitating connecting the first twin axial cable and the second processor with a circuit board associated with the interconnect, the circuit board facilitating the transmitting of the set of signals.

16. The transceiver device of claim 15, wherein the first twin axial cable is configured for transmitting the first encoded signal at the first transmission rate of at least forty gigabytes per second and the second twin axial cable is configured for transmitting the second encoded signal at the second transmission rate of at least ten gigabytes per second.

17. The transceiver device of claim 16, wherein the four or less twin axial cables further comprise a third twin axial cable configured for transmitting a third encoded signal of the set of encoded signals at the first transmission rate and a fourth twin axial cable configured for transmitting a fourth encoded signal of the set of encoded signals at the second transmission rate.

18. The device of claim 17, wherein the four or less twin axial cables are associated with a first plug assembly comprising the processor and a second plug assembly comprising a different processor, wherein the different processor is configured for transmitting at least a part of the set of encoded signals in a second direction that is opposite the first direction via the four or less twin axial cables.

19. The transceiver device of claim 15, wherein the four or less twin axial cables are configured to comprise not more than eight conductors, the not more than eight conductors being configured for transmitting the set of encoded signals at a transmission rate that is greater than two hundred gigabytes per second.

20. The transceiver device of claim 15, wherein the processor facilitates execution of the computer-executable instructions to perform the operations further comprising:

selecting a communication protocol to encode the set of signals based on a transmission rate selection received by the processor for the separate transmission rates from an external device.

\* \* \* \* \*